(12) United States Patent
Onishi et al.

(10) Patent No.: US 7,700,400 B2
(45) Date of Patent: Apr. 20, 2010

(54) BACK JUNCTION SOLAR CELL AND PROCESS FOR PRODUCING THE SAME

(75) Inventors: Tsutomu Onishi, Niigata (JP); Takeshi Akatsuka, Niigata (JP); Shunichi Igarashi, Niigata (JP)

(73) Assignees: Naoetsu Electronics Co., Ltd., Niigata (JP); Shin-Etsu Chemical Co., Ltd., Tokyo (JP)

( * ) Notice: Subject to any disclaimer, the term of this patent is extended or adjusted under 35 U.S.C. 154(b) by 70 days.

(21) Appl. No.: 11/722,811

(22) PCT Filed: Oct. 21, 2005

(86) PCT No.: PCT/JP2005/019383

§ 371 (c)(1),
(2), (4) Date: Jun. 26, 2007

(87) PCT Pub. No.: WO2006/075426

PCT Pub. Date: Jul. 20, 2006

(65) Prior Publication Data

US 2007/0264746 A1    Nov. 15, 2007

(30) Foreign Application Priority Data

Dec. 27, 2004   (JP) .............................. 2004-376603

(51) Int. Cl.
*H01L 21/00* (2006.01)
(52) U.S. Cl. ............................ 438/98; 438/57; 438/459; 257/E31.001; 257/E31.039
(58) Field of Classification Search .................. 438/98, 438/57, 459
See application file for complete search history.

(56) References Cited

U.S. PATENT DOCUMENTS 5,641,362 A  *  6/1997  Meier .......................... 136/256

(Continued)

FOREIGN PATENT DOCUMENTS

JP          9-172196           6/1997

(Continued)

OTHER PUBLICATIONS

English Language Abstract and translation of paragraphs [0005] and [0016] of JP2003-124483.

(Continued)

*Primary Examiner*—Alexander G Ghyka
(74) *Attorney, Agent, or Firm*—Greenblum & Bernstein, P.L.C.

(57) ABSTRACT

The present invention can finely arrange $p^+$-type diffusion layers and $n^+$-type diffusion layers. A $p^+$-type diffusion layer 2 and an $n^+$-type diffusion layer 3 are simultaneously formed on a back surface 1a of a semiconductor substrate 1 in a state that the $p^+$-type diffusion layer 2 and the $n^+$-type diffusion layer 3 are arranged close to each other, and a back surface 1a side of the semiconductor substrate 1 on which outer end portions of the $p^+$-type diffusion layers 2 and the $n^+$-type diffusion layers 3 are brought into contact with each other is removed thus separating the $p^+$-type diffusion layer 2 and the $n^+$-type diffusion layer 3 from each other and hence, the $p^+$-type diffusion layer 2 and the $n^+$-type diffusion layer 3 can be separately arranged in a state that the $p^+$-type diffusion layer 2 and the $n^+$-type diffusion layer 3 are arranged close to each other.

3 Claims, 3 Drawing Sheets

U.S. PATENT DOCUMENTS

| | | | |
|---|---|---|---|
| 6,262,359 B1 * | 7/2001 | Meier et al. | 136/256 |
| 7,029,943 B2 * | 4/2006 | Kruhler | 438/57 |
| 7,144,751 B2 * | 12/2006 | Gee et al. | 438/98 |
| 7,339,110 B1 * | 3/2008 | Mulligan et al. | 136/256 |
| 7,381,887 B2 * | 6/2008 | Tanaka | 136/256 |
| 2001/0050404 A1 * | 12/2001 | Saito et al. | 257/461 |
| 2008/0128268 A1 * | 6/2008 | Lopatin et al. | 204/192.1 |
| 2008/0138999 A1 * | 6/2008 | Eldershaw | 438/759 |

FOREIGN PATENT DOCUMENTS

| | | |
|---|---|---|
| JP | 2002-057352 | 2/2002 |
| JP | 2002-164556 | 6/2002 |
| JP | 2003-124483 | 4/2003 |
| JP | 2004-071763 | 3/2004 |
| JP | 2004-071828 | 3/2004 |

OTHER PUBLICATIONS

English Language Abstract and translation of paragraphs [0011] and [0018] of JP 2004-071763.
English Language Abstract and translation of paragraph [0019]of JP 2002-057352.
English Language Abstract of JP 9-172196.
English Language Abstract of JP 2002-164556.
English Language Abstract of JP 2004-071828.

* cited by examiner (a)

(b)

(c)

BACK JUNCTION SOLAR CELL AND PROCESS FOR PRODUCING THE SAME

TECHNICAL FIELD

The present invention relates to the structure of a back-contact-type solar cell which arranges positive and negative electrodes on a back surface thereof opposite to a light receiving surface thereof and a manufacturing method of the solar cell.

Particularly, the present invention relates to a back-contact-type solar cell in which a linear $p^+$-type diffusion layer and a linear $n^+$-type diffusion layer are alternately formed on a back surface of a semiconductor substrate and positive and negative back surface electrodes are separately connected to both diffusion layers, and to a manufacturing method of the solar cell.

BACKGROUND ART

Conventionally, as this type of back-contact-type solar cell and a manufacturing method thereof, there has been known a following back-contact-type solar cell and a manufacturing method thereof as described below. That is, a silicon oxide film is formed on a back surface side of the silicon substrate as a mask for impurity diffusion, a predetermined portion of the silicon oxide film is removed by etching and, thereafter, an n-type diffusion layer ($n^+$ region) is formed on the predetermined portion. Then, the silicon oxide film which is used as the mask for impurity diffusion is removed and, thereafter, a p-type diffusion layer ($p^+$ region) is formed. On the p-type diffusion layer, a back surface electrode which is brought into contact with the n-type diffusion layer in a dotted manner and an electrode which is brought into contact with the P-type diffusion layer in a dotted manner are respectively formed. Both diffusion layers and both electrodes are formed in a comb-teeth shape such that the diffusion layers and the electrodes have oppositely-facing portions thereof merged with each other on a back surface side of the silicon substrate (see Patent Reference 1, for example).

Further, there has also been known a back-contact-type solar cell in which a linear $n^+$-type diffusion layer and a linear $p^+$-type diffusion layer are alternately formed on a back surface of a semiconductor substrate at equal pitches (see Patent Reference 2, for example).

Patent Reference 1: Japanese Patent Laid-open 2002-164556 (page 2 to 3, FIG. 1 and FIG. 4)

Patent Reference 2: Japanese Patent Laid-open 2004-71828 (page 2, FIG. 1(a))

DISCLOSURE OF THE INVENTION

Problem to be Solved by the Invention

However, in such conventional back-contact-type solar cell and manufacturing method thereof, it is desirable to arrange a linear $p^+$-type diffusion layer and a linear $n^+$-type diffusion layer close to each other for enhancing photoelectric conversion efficiency. However, when heat diffusion takes place in a state that p-type and n-type impurities are arranged close to each other on a back surface side of a semiconductor substrate, the diffusion of impurities into the inside of the semiconductor substrate is performed isotropically and the diffusion grows due to auto-doping also into a substrate portion which is not brought into contact with the impurities and hence, outer end portions of these $p^+$-type diffusion layer and $n^+$-type diffusion layer are brought into contact with each other outside the substrate thus giving rise to a drawback that positive and negative electrodes are not taken out.

To overcome this drawback, it is necessary to separate the $p^+$-type diffusion layer and the $n^+$-type diffusion layer with a distance which prevents the layers from coming into contact with each other even when the layers respectively grow by diffusion. In such an arrangement, distances though which electrons and holes generated by the incidence of light move to the $p^+$-type diffusion layer and $n^+$-type diffusion layer become long, thus giving rise to a drawback that the photoelectric conversion efficiency is lowered.

Out of the present inventions, the inventions described in claims 1 and 3 aims at the fine arrangement of a $p^+$-type diffusion layer and an $n^+$-type diffusion layer without bringing the layers into contact with each other.

The invention described in claim 2 aims at, in addition to the object of the present invention described in claim 1, the simple separation of the $p^+$-type diffusion layer and $n^+$-type diffusion layer without detecting contact positions of the layers.

The invention described in the claims aims at performing the removal of back surfaces of a large number of semiconductors at one time.

Means for Solving Problem

To achieve the above-mentioned object, the invention described in claim 1 out of the present inventions is characterized in that the $p^+$-type diffusion layer and the $n^+$-type diffusion layer are simultaneously formed on the back surface of the semiconductor substrate in a state that the $p^+$-type diffusion layer and the $n^+$-type diffusion layer are arranged close to each other, and a back surface side of the semiconductor substrate on which outer end portions of the $p^+$-type diffusion layer and the $n^+$-type diffusion layer are brought into contact with each other is removed thus separating the $p^+$-type diffusion layer and the $n^+$-type diffusion layer from each other.

The invention described in claim 2 is characterized by adding, to the constitution of the invention described in claim 1, the constitution that a substrate portion is exposed between both diffusion layers by removing a whole outer layer portion of the back surface side of the semiconductor substrate on which the outer end portions of the $p^+$-type diffusion layer and the $n^+$-type diffusion layer are brought into contact with each other.

The invention described in claim 3 is characterized by including the steps of: simultaneously forming the $p^+$-type diffusion layer and the $n^+$-type diffusion layer on the back surface of the semiconductor substrate in a state that the $p^+$-type diffusion layer and the $n^+$-type diffusion layer are arranged close to each other; separating the $p^+$-type diffusion layer and the $n^+$-type diffusion layer by removing a back surface side of the semiconductor substrate on which outer end portions of the $p^+$-type diffusion layer and the $n^+$-type diffusion layer are brought into contact with each other; and separately connecting positive and negative back surface electrodes to both exposed surface of $p^+$-type diffusion layer and exposed surface of the $n^+$-type diffusion layer which are separated by the removing step.

The invention described in the claims aims is characterized by the constitution that a whole outer layer portion of the back surface side of the semiconductor substrate on which the outer end portions of the $p^+$-type diffusion layer and the $n^+$-type diffusion layer are brought into contact with each other is removed by etching.

In the inventions described in claims 1 and 3 out of the present inventions, the $p^+$-type diffusion layer and the $n^+$-type diffusion layer are simultaneously formed on the back surface of the semiconductor substrate in a state that the p$^+$-type diffusion layer and the n$^+$-type diffusion layer are arranged close to each other, and a back surface side of the semiconductor substrate on which outer end portions of the p$^+$-type diffusion layers and the n$^+$-type diffusion layers are brought into contact with each other is removed thus separating the p$^+$-type diffusion layer and the n$^+$-type diffusion layer from each other and hence, the p$^+$-type diffusion layer and the n$^+$-type diffusion layer are separately arranged in a state that the p$^+$-type diffusion layer and the n$^+$-type diffusion layer are arranged close to each other.

Accordingly, the p$^+$-type diffusion layer and the n$^+$-type diffusion layer can be finely arranged without bringing the layers into contact with each other.

As a result, compared to the conventional back-contact-type solar cell in which it is necessary to separate the p$^+$-type diffusion layer and the n$^+$-type diffusion layer with a distance which prevents the layers from coming into contact with each other even when the layers respectively grow by diffusion, a distance through which electrons and positive holes which are generated by the incidence of light move to the p$^+$-type diffusion layer and the n$^+$-type diffusion layer can be remarkably shortened thus enhancing the photoelectric conversion efficiency.

Further, the p$^+$-type diffusion layer and the n$^+$-type diffusion layer can be simultaneously formed and hence, compared to the conventional back-contact-type solar cell which forms both diffusion layers separately, the back-contact-type solar cell can be manufactured easily and at a low cost within a short time.

The invention described in claim 2 can, in addition to the effects of the invention described in claim 1, obtain an effect that by exposing the substrate portion between both diffusion layers by removing the whole outer layer portion of the back surface side of the semiconductor substrate on which outer end portions of the p$^+$-type diffusion layer and the n$^+$-type diffusion layer are brought into contact with each other, the p$^+$-type diffusion layer and the n$^+$-type diffusion layer are arranged close to each other with the substrate portion sandwiched therebetween.

Accordingly, it is possible to easily separate the p$^+$-type diffusion layer and the n$^+$-type diffusion layer without detecting the contact position of the layers.

The invention described in claim 4 can, in addition to the effects of the invention described in claim 3, obtain an effect that by removing, by etching, the whole outer layer portion of the back surface side of the semiconductor substrate on which outer end portions of the p$^+$-type diffusion layer and the n$^+$-type diffusion layers are brought into contact with each other, back surfaces of a large number of semiconductor substrates can be simultaneously removed.

Accordingly, the removal of back surfaces of a large number of semiconductor substrates can be performed at one time.

As a result, compared to a back-contact-type solar cell in which the whole outer layer portion of the back surface side of the semiconductor is removed by cutting by mechanical foliage processing using a cutting machine, the processing time per unit sheet can be largely shortened thus not only enhancing the productivity but also further reducing of a manufacturing cost.

BEST MODE FOR CARRYING OUT THE INVENTION

Hereinafter, one embodiment of the present invention is explained in conjunction with drawings.

A back-contact-type solar cell A of the present invention is constituted as follows. As shown in FIG. 1 to FIG. 4, on a back surface 1$a$ of a p$^-$-type (or n$^-$-type) semiconductor substrate 1, linear p$^+$-type diffusion layers 2 and linear n$^+$-type diffusion layers 3 are formed simultaneously in a state that the layers are alternately arranged close to each other. Both p$^+$-type diffusion layers 2 and the n$^+$-type diffusion layers 3 are separated from each other by removing a back surface 1$a$ side of the semiconductor substrate 1 on which outer end portions of the p$^+$-type diffusion layer 2 and the n$^+$-type diffusion layer 3 are brought into contact with each other. Further, positive and negative back surface electrodes 4, 5 are respectively connected to exposed surfaces 2$a$ of the p$^+$-type diffusion layers 2 and exposed surfaces 3$a$ of the n$^+$-type diffusion layers 3 which are separated due to the above-mentioned removal thus enabling the supply of electricity from a side opposite to a light receiving surface 1$d$.

The above-mentioned p$^+$-type diffusion layer 2 and the n$^+$-type diffusion layer 3 are formed as follows. A paste 2' made of boron or the like, for example, as a p$^+$-type impurity and a paste 3' made of phosphorus or the like, for example, as an n$^+$-type impurity are respectively applied to the back surface 1$a$ of the semiconductor substrate 1 made of silicon single crystal or poly-crystal silicon with desired shapes using a technique such as pattern printing.

The paste 2' of the p$^+$-type impurity and the paste 3' of the n$^+$-type impurity are arranged linearly substantially parallel to each other in a state that the pastes 2' and 3' are arranged close to each other. By heating the whole semiconductor substrate 1 together with the respective pastes 2', 3' up to a predetermined temperature by baking or the like, the p$^+$-type impurity 2' and the n$^+$-type impurity 3' are respectively thermally diffused into the inside of the semiconductor substrate 1 simultaneously, and a region of the p$^+$-type diffusion layer 2 and a region of the n$^+$-type diffusion layer 3 are alternately and simultaneously formed in a state that the p$^+$-type impurity 2' and the n$^+$-type impurity 3' are arranged close to each other.

Further, in the above-mentioned thermal diffusion processing, the diffusion of the p$^+$-type impurity 2' and the diffusion of the n$^+$-type impurity 3' into the inside of the semiconductor substrate 1 are performed isotropically and the diffusion of the p$^+$-type impurity 2' and the n$^+$-type impurity 3' into a substrate portion 1$c$ also grows due to autodoping and hence, outer end portions of the p$^+$-type diffusion layer 2 and the n$^+$-type diffusion layer 3 are brought into contact with each other on the back surface 1$a$ side of the semiconductor substrate 1.

Accordingly, at least both diffusion layers 2, 3 are separated from each other by removing the back surface 1$a$ side of the semiconductor substrate 1 on which the outer end portions of the above-mentioned p$^+$-type diffusion layer 2 and n$^+$-type diffusion layer 3 are brought into contact with each other. In this embodiment, for example, a whole outer layer portion 1$b$ of a predetermined depth from the back surface 1$a$ of the semiconductor substrate 1 is chemically removed by an etchant or the like, or is removed mechanically by cutting using a cutting machine and hence, the respective p$^+$-type diffusion layer 2 and n$^+$-type diffusion layer 3 are separated from each other thus exposing a substrate portion 1$c$ of the semiconductor substrate 1 made of silicon between the layers.

Further, to a newly exposed surface 2$a$ of the p$^+$-type diffusion layer 2 and a newly exposed surface 3$a$ of the n$^+$-type diffusion layer 3 which are separated from each other due to the above-mentioned removing step, the positive and negative back surface electrodes 4, 5 which are formed linearly in the same manner as the exposed surfaces 2$a$, 3$a$ are respectively connected.

Here, in the case of the illustrated example, the above-mentioned paste 2' of the p+-type impurity and the paste 3' of the n+-type impurity are printed in a comb-teeth shape by patterning. By thermally diffusing the respective pastes 2', 3', the region of the p+-type diffusion layer 2' and the region of n+-type diffusion layer 3' are simultaneously formed in a comb-teeth shape, and the back surface electrodes 4, 5 which are also formed in the comb-teeth shape as the p+-type diffusion layer 2 and the n+-type diffusion layer 3 are formed on the p+-type diffusion layer 2 and the n+-type diffusion layer 3 and engage with the p+-type diffusion layer 2 and n+-type diffusion layer 3 in a comb-teeth manner.

Further, on the light receiving surface 1d side of the above-mentioned semiconductor substrate 1, a p+-type light receiving side diffusion layer 6 is formed when the semiconductor substrate 1 is of a p−-type, while an n+-type light receiving side diffusion layer 6 is formed when the semiconductor substrate 1 is of an n−-type. On a front surface side of the light receiving side diffusion layer 6, as shown in the drawing, an anti-reflection film 7 may be formed when necessary.

Next, a manufacturing method of the back-contact-type solar cell A according to the present invention is explained in order of steps by especially focusing on the back surface 1a side of the semiconductor substrate 1.

First of all, as shown in FIG. 3(a) and FIG. 4(a), to the back surface 1a of the semiconductor substrate 1, the paste 2' of the p-type impurity and the paste 3' of the n-type impurity are applied in substantially parallel to each other or in a comb-teeth shape as shown in the drawing using a technique such as pattern printing in a state that the pastes 2', 3' are linearly and alternately arranged close to each other.

Here, to the light receiving surface 1d of the semiconductor substrate 1, an n-type or p-type impurity paste 6' for forming the light receiving side diffusion layer 6 is applied.

Thereafter, as shown in FIG. 3(b) and FIG. 4(b), at least the paste 2' of the p-type impurity and the paste 3' of the n-type impurity are heated to simultaneously thermally diffuse the pastes thus forming the region of the p+-type diffusion layer 2 and the region of the n+-type diffusion layer 3 in the inside of the semiconductor substrate 1.

Here, the diffusion of the p-type impurity 2' and the diffusion of the n-type impurity 3' into the inside of the semiconductor substrate 1 are performed isotropically and the diffusion of the p+-type impurity 2' and the diffusion of the n+-type impurity 3' into the substrate portion 1c also grow due to autodoping and hence, the outer end portions of the p+-type diffusion layer 2 and the n+-type diffusion layer 3 are brought into contact with each other on the back surface 1a side of the semiconductor substrate 1.

In such a state, as shown in FIG. 3(c) and FIG. 4(c), the outer end portions of both diffusion layers 2, 3 are separated from each other by removing the back surface 1a side of the semiconductor substrate 1 on which the outer end portions of the respective p+-type diffusion layer 2 and the n+-type diffusion layer 3 are brought into contact with each other.

In this embodiment, the whole outer layer portion 1b of a predetermined depth from the back surface 1a of the semiconductor substrate 1 is chemically removed by etching or is mechanically removed by cutting using a cutting machine or the like.

Accordingly, the p+-type diffusion layer 2 and the n+-type diffusion layer 3 are separated from each other thus exposing the substrate portion 1c of the semiconductor substrate 1 made of silicon therebetween.

Thereafter, by respectively connecting the positive and negative back surface electrodes 4, 5 which are formed linearly in the same manner to the newly exposed surface 2a of the p+-type diffusion layer 2 and the newly exposed surface 3a of the n+-type diffusion layer 3 which are separated from each other due to the above-mentioned removing step, the manufacturing steps of the back surface 1a side of the back-contact-type solar cell are completed.

In this manner, according to the back-contact-type solar cell A of the present invention and the manufacturing method thereof, the above-mentioned p+-type diffusion layer 2 and the n+-type diffusion layer 3 are separately arranged in a state that the layers are arranged close to each other and hence, a distance through which electrons and positive holes generated by the incidence of light move to the p+-type diffusion layer 2 and the n+-type diffusion layer 3 is remarkably shortened thus enhancing the photoelectric conversion efficiency.

Further, the p+-type diffusion layer 2 and the n+-type diffusion layer 3 are formed simultaneously and hence, it is possible to obtain an advantage that both diffusion layers 2, 3 can be easily manufactured within a short time.

Further, when the whole outer layer portion 1b of a predetermined depth from the back surface 1a of the semiconductor substrate 1 on which the outer end portions of the p+-type diffusion layer 2 and the n+-type diffusion layer 3 are brought into contact with each other is removed thus exposing the substrate portion 1c between both diffusion layers 2, 3, the p+-type diffusion layer 2 and the n+-type diffusion layer 3 are finely arranged in a state that the layers are arranged close to each other with the substrate portion 1c sandwiched therebetween and hence, it is possible to obtain an advantage that the p+-type diffusion layer 2 and the n+-type diffusion layer 3 can be easily separated from each other without the detection of a contact position between the p+-type diffusion layer 2 and the n+-type diffusion layer 3.

Still further, when the whole outer layer portion 1b of a predetermined depth from the back surface 1a of the semiconductor substrate 1 on which the outer end portions of the p+-type diffusion layer 2 and the n+-type diffusion layer 3 are brought into contact with each other is chemically removed by etching, back surfaces 1a of a large number of semiconductor substrates 1 can be removed simultaneously and hence, it is possible to obtain an advantage that processing time per unit sheet can be remarkably shortened thus enhancing the productivity.

Here, in the above-mentioned embodiment, as one example in which both p+-type diffusion layer 2 and the n+-type diffusion layer 3 are separated from each other by removing the back surface 1a side of the semiconductor substrate 1 on which outer end portions of the diffusion layers 2, 3 are brought into contact with each other, the whole outer layer portion 1b of a predetermined depth from the back surface 1a of the semiconductor substrate 1 is removed. However, the present invention is not limited to the above-mentioned embodiment. That is, by removing only a boundary portion where the outer end portions of the p+-type diffusion layer 2 and the n+-type diffusion layer 3 are brought into contact with each other, the outer end portion of the p+-type diffusion layer 2 and the outer end portion of the n+-type diffusion layer 3 may be separated from each other.

Further, in this embodiment, although the n+-type or p+-type light-receiving-side diffusion layer 6 is formed on the light receiving surface 1d side of the semiconductor substrate 1 and, an anti-reflection film 7 is formed on a front surface side of the light receiving side diffusion layer 6, the present invention is not limited to the above-mentioned embodiment.

Figure 1:
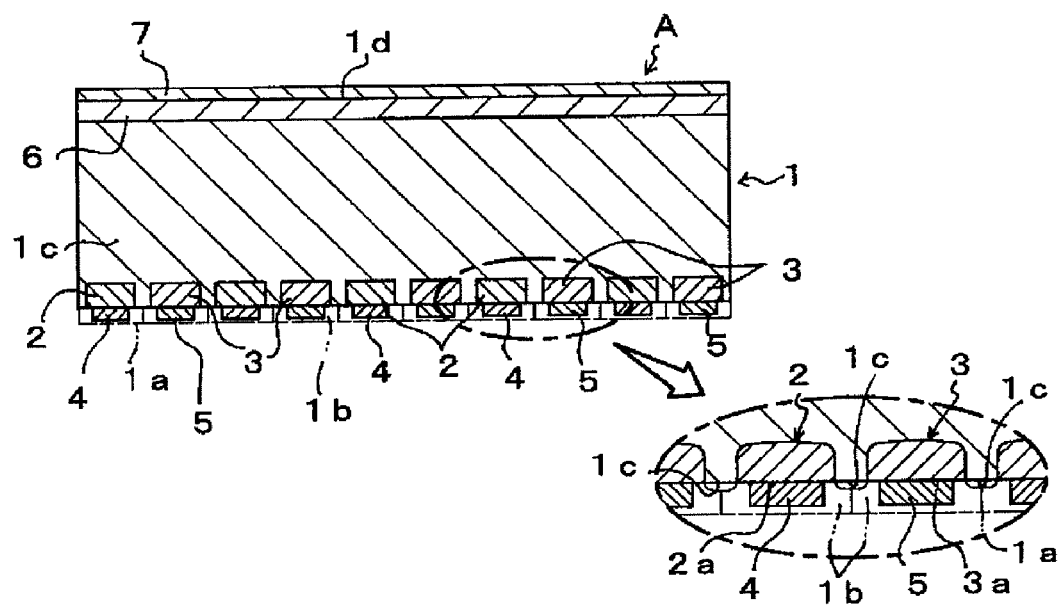
FIG. 1 is a longitudinal cross-sectional view of a vertical cross section showing one embodiment of a back-contact-type solar cell of the present invention and also showing an essential part of the back-contact-type solar cell in an enlarged manner.
Figure 2:
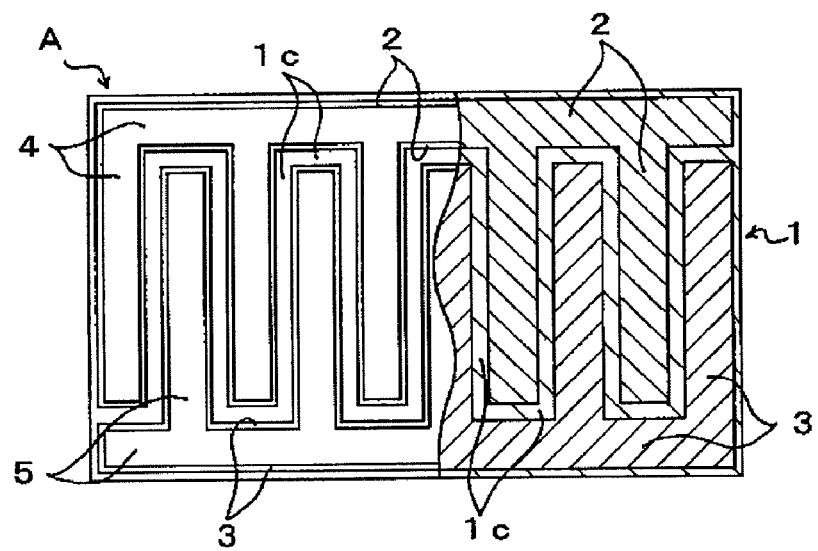
FIG. 2 is a shrunken bottom view of the back-contact-type solar cell with a part broken away.
Figure 3:
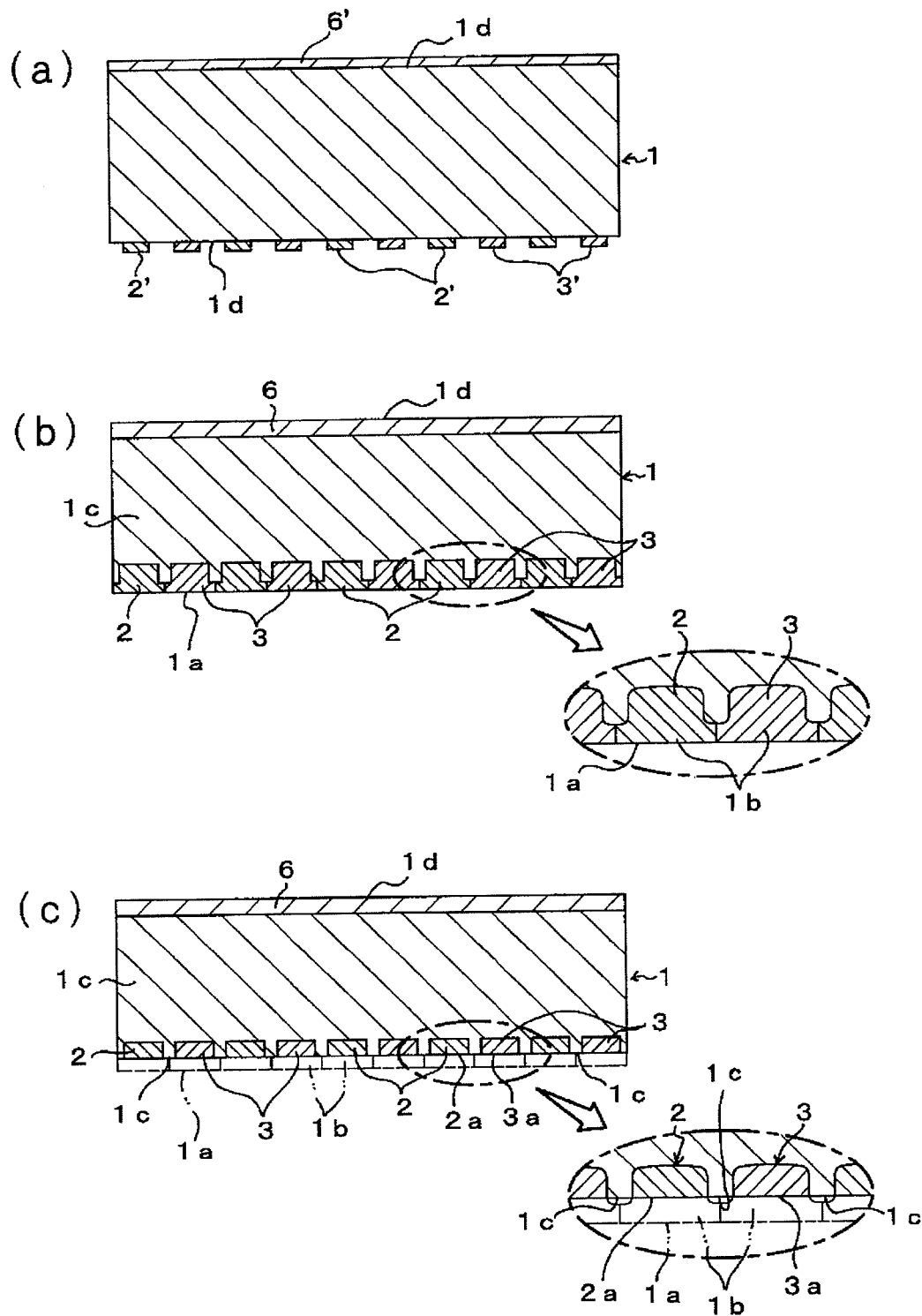
FIG. 3 are longitudinal cross-sectional views of a vertical cross section showing one embodiment of a manufacturing method of the back-contact-type solar cell of the present invention, wherein steps of the manufacturing method are shown in order of (a) to (c) and also showing an essential part of the back-contact-type solar cell in an enlarged manner.
Figure 4:
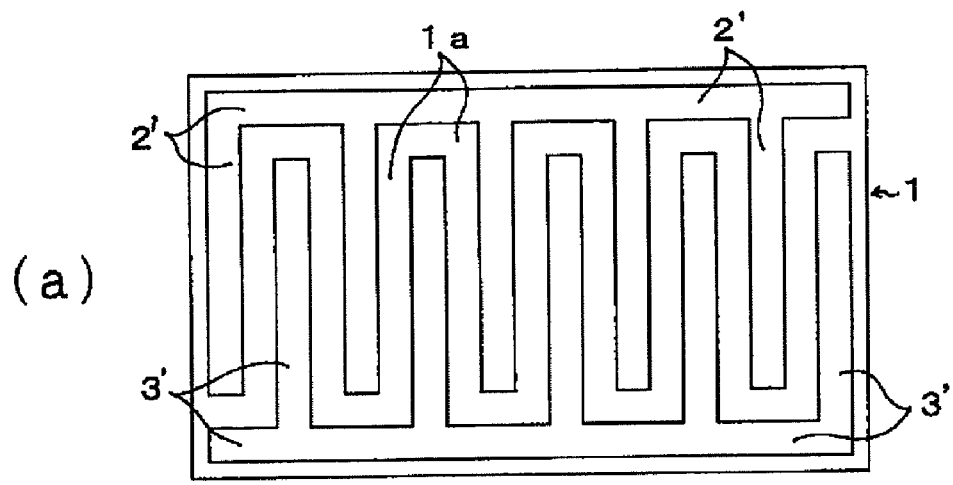
FIG. 4 are shrunken bottom views corresponding to FIG. 3(a) to FIG. 3(c).
Figure 4:
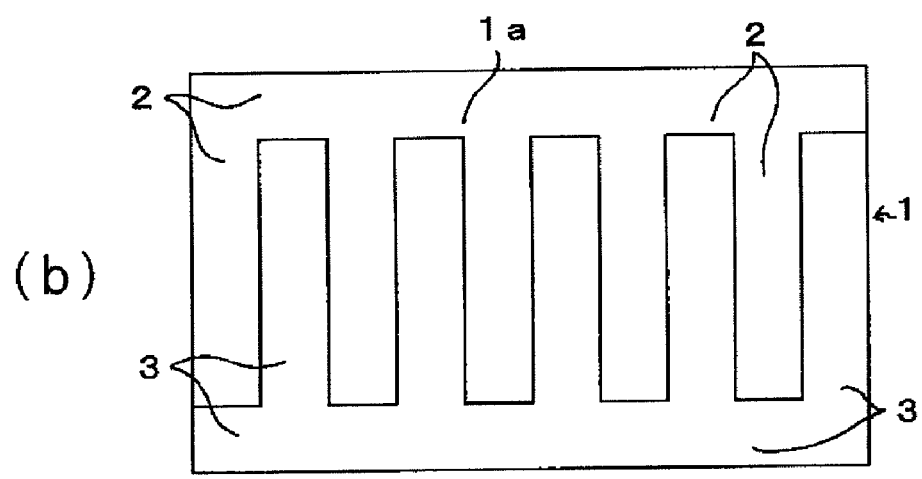
Figure 4:
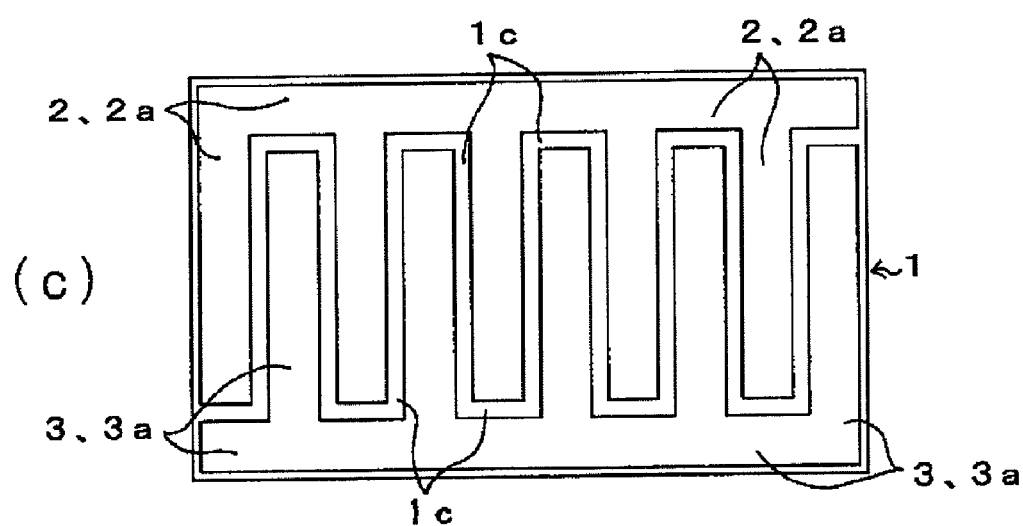

The invention claimed is:

1. A manufacturing method of a back-contact-type solar cell in which a linear $p^+$-type diffusion layer and a linear $n^+$-type diffusion layer are alternately formed on a back surface of a semiconductor substrate and positive and negative back surface electrodes are separately connected to both diffusion layers, the manufacturing method comprising:

simultaneously forming the $p^+$-type diffusion layer and the $n^+$-type diffusion layer on the back surface of the semiconductor substrate in a state that the $p^+$-type diffusion layer and the $n^+$-type diffusion layer are arranged close to each other;

separating the $p^+$-type diffusion layer and the $n^+$-type diffusion layer by removing a back surface of the semiconductor substrate on which outer end portions of the $p^+$-type diffusion layer and the $n^+$-type diffusion layer are brought into contact with each other, exposing a substrate portion after removal, forming a fine arrangement of the $p^+$-type and $n^+$-type diffusion layers and enhancing photoelectric conversion efficiency; and separately connecting positive and negative back surface electrodes to both the exposed surface of $p^+$-type diffusion layer and exposed surface of the $n^+$-type diffusion layer which are separated by the removing.

2. The manufacturing method of a back-contact-type solar cell according to claim 1, wherein a whole outer layer portion of the back surface of the semiconductor substrate on which the outer end portions of the $p^+$-type diffusion layer and the $n^+$-type diffusion layer are brought into contact with each other is removed by etching.

3. The manufacturing method according to claim 1, the simultaneously forming comprising simultaneously forming the $p^+$-type diffusion layer and the $n^+$-type diffusion layer by applying a paste of a $p^+$-type impurity and a paste of an $n^+$-type impurity to the back surface of the semiconductor substrate and then heating the semiconductor substrate to simultaneously diffuse the $p^+$-type impurity and the $n^+$-type impurity.

* * * * *